(12) United States Patent
Choi

(10) Patent No.: US 10,665,732 B2
(45) Date of Patent: May 26, 2020

(54) PASTE COMPOSITION FOR FORMING SOLAR CELL ELECTRODE, SOLAR CELL ELECTRODE, AND SOLAR CELL

(71) Applicant: DK Electronic Materials Co., Ltd, Jiangsu (CN)

(72) Inventor: Young-Wook Choi, Jiangsu (CN)

(73) Assignee: DK Electronic Materials, Inc., Yixing, Jiangsu (CN)

( * ) Notice: Subject to any disclaimer, the term of this patent is extended or adjusted under 35 U.S.C. 154(b) by 0 days.

(21) Appl. No.: 15/739,753

(22) PCT Filed: Dec. 30, 2016

(86) PCT No.: PCT/CN2016/113528
§ 371 (c)(1),
(2) Date: Dec. 25, 2017

(87) PCT Pub. No.: WO2018/120030
PCT Pub. Date: Jul. 5, 2018

(65) Prior Publication Data
US 2020/0044101 A1 Feb. 6, 2020

(51) Int. Cl.
*H01B 1/00* (2006.01)
*H01L 31/00* (2006.01)
(Continued)

(52) U.S. Cl.
CPC ...... *H01L 31/022425* (2013.01); *C03C 3/102* (2013.01); *C03C 3/122* (2013.01);
(Continued)

(58) Field of Classification Search
CPC ... H01B 1/00; H01B 1/16; H01B 1/22; C09D 5/24; H01L 31/0224; H01L 35/14
See application file for complete search history.

(56) References Cited

U.S. PATENT DOCUMENTS 9,834,470 B1 * 12/2017 Hilali .............. C03C 3/122
2014/0131629 A1 * 5/2014 Choi .................. H01B 1/22
252/514
(Continued)

FOREIGN PATENT DOCUMENTS

| CN | 104150777 A | 11/2014 |
|---|---|---|
| CN | 104575661 A | 4/2015 |
| JP | 2015092567 A | 5/2015 |

OTHER PUBLICATIONS

International Search Report for PCT application No. PCT/CN2016/113528 filed on Dec. 30, 2016; dated Sep. 26, 2017.
(Continued)

*Primary Examiner* — Mark Kopec
(74) *Attorney, Agent, or Firm* — Gang Yu

(57) ABSTRACT

Disclosed are a paste composition for forming a solar cell electrode, a solar cell electrode, and a solar cell. The paste composition includes a conductive powder, an organic vehicle and a glass frit, wherein the glass frit contains 0.1-20 wt % of PbO, 30-60 wt % of $Bi_2O_3$, 1.0-15 wt % of $TeO_2$ and 8-30 wt % of $WO_3$, and a mass ratio of $TeO_2$ to $WO_3$ is 0.5:1 to 1.75:1. The solar cell electrode formed of the paste composition of the present invention has excellent adhesive strength with respect to a soldering ribbon and minimizes serial resistance (Rs), thus provides high conversion efficiency.

10 Claims, 1 Drawing Sheet

(51) Int. Cl.
*H01L 31/0224* (2006.01)
*C03C 3/102* (2006.01)
*C03C 3/12* (2006.01)
*C03C 4/14* (2006.01)
*C03C 8/10* (2006.01)
*C03C 8/18* (2006.01)
*H01B 1/16* (2006.01)

(52) U.S. Cl.
CPC .................. *C03C 4/14* (2013.01); *C03C 8/10* (2013.01); *C03C 8/18* (2013.01); *H01B 1/16* (2013.01); *C03C 2204/00* (2013.01); *C03C 2205/00* (2013.01)

(56) References Cited

U.S. PATENT DOCUMENTS

2014/0175340 A1* 6/2014 Choi .................. C03C 8/04
  252/514
2015/0115207 A1 4/2015 Shih et al.
2018/0301574 A1* 10/2018 Torardi .................. C09D 5/24
2018/0358486 A1* 12/2018 Shih .................. C09D 5/24
2019/0312160 A1* 10/2019 Jung .................. C09D 11/037

OTHER PUBLICATIONS

The extended Search Report for corresponding EP patent application No. 16905692.6 dated Dec. 20, 2018.

* cited by examiner

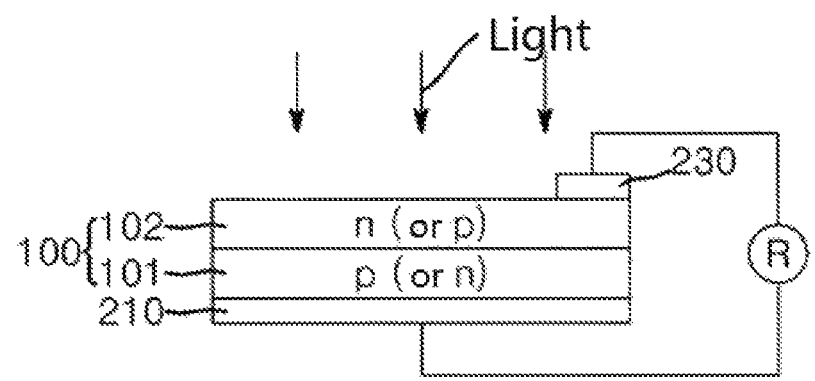

PASTE COMPOSITION FOR FORMING SOLAR CELL ELECTRODE, SOLAR CELL ELECTRODE, AND SOLAR CELL

TECHNICAL FIELD

The present invention relates to the technical field of solar cell manufacturing, and more particularly to a paste composition for forming a solar cell electrode, a solar cell electrode, and a solar cell.

BACKGROUND

A solar cell converts photons of sunlight by utilizing photovoltaic effect of a p-n junction to generate electric energy. In the solar cell, a front electrode and a back electrode are formed on upper and lower surfaces of a semiconductor wafer or substrate having a p-n junction. Induced by light, the photovoltaic effect occurs at the p-n junction of the semiconductor wafer with a flow of electrons, which further provides current for the outside through an electrode. A composition for the electrode is disposed on the wafer with designed pattern, and baked to form an electrode of the solar cell.

The efficiency of the solar cell is improved by means of continuous reduction of the emitter thickness, which may result in shunt and deteriorate the performance of the solar cell. In addition, the area of the solar cell has been gradually increased to improve the efficiency. However, under this circumstance, the problem of efficiency loss resulting from the increase of the contact resistance of the solar cell may exist.

Solar cells are connected to each other through ribbons to form a solar cell assembly. At present, large serial resistance and conversion efficiency loss will result from insufficient bonding between a solar cell electrode, prepared from typical components including lead-containing glass frits, and a soldering ribbon, and low adhesion between the electrode and the ribbon.

SUMMARY

The present invention is aimed to provide a paste composition for forming a solar cell electrode, a solar cell electrode, and a solar cell, which are intended to solve the technical problems in the conventional art of low adhesion between electrodes and ribbons, large serial resistance and deterioration in conversion efficiency caused by low adhesion between electrodes and ribbons.

To this end, according to an aspect of the present invention, a paste composition for forming a solar cell electrode is provided. The paste composition includes a conductive powder, an organic vehicle and a glass frit, wherein the glass frit contains 0.1-20 wt % of PbO, 30-60 wt % of $Bi_2O_3$, 1.0-15 wt % of $TeO_2$ and 8-30 wt % of $WO_3$, and a mass ratio of $TeO_2$ to $WO_3$ ranging from 0.5:1 to 1.75:1.

Further, the glass frit contains other oxide, being one or more oxides selected from a group consisting of $Li_2O$, $Na_2O$, $K_2O$, MgO, CaO, SrO, BaO, $P_2O_5$, ZnO, $SiO_2$, $B_2O_3$, $TiO_2$ and NiO.

Further, the other oxide in the glass frit is 1-25 wt %.

Further, an average particle diameter $D_{50}$ of the glass frit is 0.1-10 μm.

Further, the paste composition includes 60-95 wt % of conductive powder, 1.0-20 wt % of the organic vehicle, 0.1-5 wt % of glass frit, and the balance additive.

Further, the additive is one or more additives selected from a group consisting of a dispersant, a thixotropic agent, a plasticizer, a viscosity stabilizer, an anti-foaming agent, a pigment, a UV stabilizer, an antioxidant and a coupling agent.

Further, the conductive powder is silver powder.

Further, the average particle diameter $D_{50}$ of the silver powder is 0.1-10 μm.

According to another aspect of the present invention, a solar cell electrode is provided. The solar cell electrode is formed of the paste composition as any one of the above.

According to a further aspect of the present invention, a solar cell is provided. The solar cell includes an electrode. The electrode is the solar cell electrode formed of the paste composition as any one of the above.

The solar cell electrode formed by the paste composition of the present invention has excellent adhesive strength with respect to the soldering ribbon and minimizes serial resistance (Rs), thus provides high conversion efficiency.

BRIEF DESCRIPTION OF THE DRAWINGS

The accompanying drawings of the specification, forming a part of the present application, are adopted to provide further understanding of the present invention. The schematic embodiments and description of the present invention are adopted to explain the present invention, and do not form improper limits to the present invention. In the drawings:

The Drawing shows a schematic view of a solar cell manufactured using a composition in accordance with one embodiment of the present invention.

DETAILED DESCRIPTION OF THE EMBODIMENTS

It is important to note that embodiments in the present application and features in the embodiments may be combined under the condition of no conflicts. The present invention will be illustrated herein below with reference to the drawings and in conjunction with the embodiments in detail.

According to a typical embodiment of the present invention, a paste composition for forming a solar cell electrode is provided. The paste composition includes a conductive powder, an organic vehicle and a glass frit, wherein the glass frit contains 0.1-20 wt % of PbO, 30-60 wt % of $Bi_2O_3$, 1.0-15 wt % of $TeO_2$ and 8-30 wt % of $WO_3$, and a mass ratio of $TeO_2$ to $WO_3$ is 0.5:1 to 1.75:1. Preferably, the conductive powder is silver powder.

The solar cell electrode formed of the paste composition of the present invention is has excellent adhesive strength with respect to a soldering ribbon and minimizes serial resistance (Rs), thus provides high conversion efficiency. According to a typical embodiment of the present invention, the glass frit further includes an oxide. The oxide is one or more oxides selected from a group consisting of $Li_2O$, $Na_2O$, $K_2O$, MgO, CaO, SrO, BaO, $P_2O_5$, ZnO, $SiO_2$, $B_2O_3$, $TiO_2$ and NiO, wherein the oxide in the glass frit is 1-25 wt %, that is, the oxide is 1-25 wt % of the total weight of the glass frit.

According to a typical embodiment of the present invention, the paste composition includes 60-95 wt % of conductive powder, 1.0-20 wt % of an organic vehicle, 0.1-5 wt % of glass frit, and the balance of an additive, wherein the additive is one or more additives selected from a group consisting of a dispersant, a thixotropic agent, a plasticizer, a viscosity stabilizer, an anti-foaming agent, a pigment, a UV stabilizer, an antioxidant and a coupling agent.

According to a typical embodiment of the present invention, a solar cell electrode is provided. The solar cell electrode is formed of the paste composition as any one of the above.

According to a typical embodiment of the present invention, a solar cell is provided. The solar cell includes an electrode. The electrode is the solar cell electrode formed of the paste composition as any one of the above.

According to a typical embodiment of the present invention, components of the solar cell electrode include silver powder, lead oxide-bismuth oxide-tellurium oxide-tungsten oxide base glass fit and an organic vehicle. Now, the composition of the solar cell electrode of the present invention will be described in more detail.

(A) Silver Powder

According to a typical embodiment of the present invention, the paste composition for forming a solar cell electrode includes the silver powder serving as a conductive powder. The particle size of the silver powder may be in nanometer or micrometer scale. For example, the silver powder may have the particle size of dozens to several hundred nanometers, or several to dozens of micrometers. Alternatively, the silver powder may be a mixture of two or more types of silver powder having different particle sizes.

The silver powder may a spherical, flake or amorphous shape.

The silver powder preferably has an average particle, diameter ($D_{50}$) of about 0.1 μm to 10 μm, more preferably about 0.5 μm to 5 μm. The average particle diameter may be measured by using an instrument such as Mastersize 2000 (Malvern Co., Ltd) after dispersing the conductive powder in Isopropyl Alcohol (IPA) at 25° C. for 3 minutes via ultrasonication. Within the range of the average particle diameter, the composition can provide low contact resistance and low line resistance.

Based on the total weight of the composition, the silver powder may be present in an amount of about 60 wt % to 95 wt %. Within the range, the conductive powder can prevent deterioration in conversion efficiency due to the increase of resistance. Advantageously, the conductive powder is present in an amount of about 70 wt % to 95 wt %.

(B) Lead Oxide-Bismuth Oxide-Tellurium Oxide-Tungsten Oxide-Based Glass Frit

The glass frit serves to enhance adhesion between the conductive powder and the wafer or the substrate and to form silver crystal grains in an emitter region by etching an anti-reflection layer and melting the silver powder so as to reduce contact resistance during a baking process of the electrode paste. Further, during the baking process, the glass frit is softened and decreases the baking temperature.

When the area of the solar cell is increased in order to improve solar cell efficiency, there can be a problem of increase in contact resistance of the solar cell. Thus, it is necessary to minimize serial resistance (Rs) and influence on the p-n junction. In addition, as the baking temperatures varies within a broad range due to the, increasing use of various wafers exhibiting different sheet resistances, it is desirable that the glass frit secure sufficient thermal stability to withstand a wide range of baking temperatures.

Solar cells are connected to each other by a soldering ribbon to constitute a solar cell battery. In this case, low adhesive strength between solar cell electrodes and the ribbon can cause detachment of the cells or deterioration in reliability. In this invention, in order to ensure that the solar cell has desirable electrical and physical properties such as adhesive strength, a lead oxide-bismuth oxide-tellurium oxide-tungsten oxide-based ($PbO-Bi_2O_3-TeO_2-WO_3$) glass frit is used.

In the present invention, the lead oxide-bismuth oxide-tellurium oxide-tungsten oxide-based glass frit may contain about 0.1-20 wt % of lead oxide, about 30-60 wt % of bismuth oxide, about 1.0-20 wt % of tellurium oxide and about 5-25 wt % of tungsten oxide, and a mass ratio of $TeO_2$ to $WO_3$ is 0.5:1 to 1.75:1. Within the range, the glass frit can secure both excellent adhesive strength and excellent conversion efficiency.

According to a typical embodiment of the present invention, the lead oxide-bismuth oxide-tellurium oxide-tungsten oxide-based glass frit may further include at least one oxide selected from a group consisting of lithium oxide ($Li_2O$), sodium oxide ($Na_2O$), potassium oxide ($K_2O$), magnesium oxide (MgO), calcium oxide (CaO), strontium oxide (SrO), barium oxide (BaO), phosphorus oxide ($P_2O_5$), zinc oxide (ZnO), silicon dioxide ($SiO_2$), boron oxide ($B_2O_3$), titanium oxide ($TiO_2$), and nickel oxide (NiO).

The glass frit may be prepared from lead oxide-bismuth oxide-tellurium oxide-tungsten oxide and at least one of the above-mentioned oxides by any typical method. For example, the oxide and lead oxide-bismuth oxide-tellurium oxide-tungsten oxide are mixed in a predetermined ratio. Mixing may be carried out using a ball mill or a planetary mill. The mixed composition is melted at about 900-1,300° C., followed by quenching to about 25° C. The resulting material is subjected to pulverization using a disk mill, a planetary mill, or the like, thereby providing a glass frit.

The glass frit may have an average particle diameter $D_{50}$ of about 0.1 μm to 10 μm, and may be present in an amount of about 0.1 wt % to 5 wt % based on the total amount of the composition. The glass frit may have a spherical or amorphous shape.

(C) Organic Vehicle

The organic vehicle imparts suitable viscosity and rheological characteristics for printing to the paste composition through mechanical mixing with the inorganic component of the composition for solar cell electrodes.

The organic vehicle may be any typical organic vehicle used for the composition for solar cell electrodes, and may include a binder resin, a solvent, and the like.

The binder resin may be selected from acrylate resins or cellulose resins. Ethyl cellulose is generally used as the binder resin. In addition, the binder resin may be selected among ethyl hydroxyethyl cellulose, nitrocellulose, blends of ethyl cellulose and phenol resins, alkyd, phenol, acrylate ester, xylene, polybutane, polyester, urea, melamine, vinyl acetate resins, wood rosin, polymethacrylates of alcohols, and the like.

The solvent may be selected from the group consisting of, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, and combinations thereof.

The organic vehicle may be present in an amount of about 1 wt % to 30 wt % based on the total weight of the composition. Within this range, the organic vehicle can provide sufficient adhesive strength and excellent printability to the composition.

(D) Additives

The composition may further include typical additives, as needed, to enhance flow properties, process properties, and stability. The additives may include dispersants, thixotropic agents, plasticizers, viscosity stabilizers, anti-foaming agents, pigments, UV stabilizers, antioxidants, coupling agents, and the like, without being limited thereto. These additives may be used alone or as mixtures thereof. These additives may be present in an amount of about 0.1 wt % to 5 wt % in the composition, but this amount may be changed as needed.

According to a typical embodiment of the present invention, a solar cell is formed. As shown in Drawing, a back electrode 210 and a front electrode 230 may be formed, by printing and baking the composition on a wafer or substrate 100 that includes a p-layer 101 and an n-layer 102, which will serve as an emitter. For example, a preliminary process for forming the rear electrode is performed by printing the composition on the rear surface of the wafer and drying the printed composition at about 200° C. to 400° C. for about 10 to 60 seconds. Further, a preliminary process for preparing the front electrode may be performed by printing the paste on the front surface of the wafer and drying the printed composition. Then, the front electrode and the rear electrode may be formed by baking the wafer at about 400° C. to 950° C., preferably at about 850° C. to 950° C., for about 30 to 50 seconds.

Then, the present invention will be described in more detail with reference to embodiments. However, it is important to note that provision of these embodiments is only used for illustrating the present invention and shall not be interpreted as limits to the present invention in any manner.

For clear purposes, clear detailed description of a person skilled in the art is omitted.

EMBODIMENT AND COMPARISON

Oxides are mixed according to the compositions as shown in Table 1, and are subjected to melting and sintering at 900 to 1400° C., thereby preparing lead oxide-bismuth oxide-tellurium oxide-tungsten oxide-based glass frit having an average particle diameter ($D_{50}$) of 2.0 μm.

As an organic adhesive, 1.0 wt % of ethyl cellulose is sufficiently dissolved in 9.0 wt % of butyl carbitol at 60° C., and then 86 wt % of spherical silver powder having an average particle diameter of 1.5 μm, 1.5 wt % of prepared lead oxide-bismuth oxide-tellurium oxide-tungsten oxide-zinc oxide glass frit and 0.5 wt % of a thixotropic agent Thixatrol ST are added into the binder solution, followed by mixing and kneading in a 3-roll kneader, thereby preparing a composition for solar cell electrodes.

The electrode composition prepared as above is deposited on the front surface of a crystalline mono-wafer by screen-printing in a predetermined pattern, and then is dried in an infrared drying furnace. Then, the composition for electrodes containing aluminum was printed on a rear side of the wafer and dried in the same manner. Cells formed according to this procedure were subjected to baking at 910° C. for 40 seconds in a belt-type baking furnace, and evaluated by conversion efficiency (%), serial resistance Rs (mΩ) and open voltage (Voc) using a solar cell efficiency tester CT-801 (Pasan Co., Ltd.). Then, flux was applied to the electrodes of the cells and bonded to a soldering ribbon at 300 to 400° C. using a soldering iron. Then, the adhesive strength (N/mm) between the electrode of the cell and the ribbon is measured by using a tensioner at a peeling angle of 180° and a stretching rate of 50 mm/min. The measured conversion efficiency and pull strength are shown in Table 1.

Embodiments 1-8 and Comparisons 1-9

Compositions in Embodiments 1-8 and Comparisons 1-9 for solar cell electrodes were prepared and evaluated as to physical properties in the same manner, and the glass frits were prepared in compositions as listed in Table 1. It is important to note that the embodiments and the comparisons in Table 1 are intended to highlight characteristics of one or more invention examples without limitation of the scope of the present invention as well as without showing that the comparisons are beyond the scope of the present invention. In addition, the invention subject is not limited to specific details described in the embodiments and the comparisons.

TABLE 1

| | Glass frit component (wt %) | | | | | | | Mass ratio of $TeO_2$ to $WO_3$ | Pull strength (N/mm) | Efficiency (%) |
|---|---|---|---|---|---|---|---|---|---|---|
| | PbO | $Bi_2O_3$ | $TeO_2$ | $WO_3$ | ZnO | $SiO_2$ | $Li_2O$ | | | |
| Embodiment 1 | 15 | 45 | 15 | 19 | 0 | 5 | 1 | 0.789 | 3.5 | 10.5 |
| Embodiment 2 | 5 | 50 | 15 | 19 | 5 | 5 | 1 | 0.789 | 4 | 12.4 |
| Embodiment 3 | 20 | 30 | 15 | 19 | 5 | 10 | 1 | 0.789 | 3.5 | 11.5 |
| Embodiment 4 | 0.1 | 60 | 15 | 15 | 0 | 8.9 | 1 | 1 | 3.7 | 11.1 |
| Embodiment 5 | 13 | 31 | 15 | 30 | 10 | 0 | 1 | 0.5 | 3.9 | 10.9 |
| Embodiment 6 | 7 | 50 | 14 | 8 | 10 | 10 | 1 | 1.75 | 4.5 | 11.7 |
| Embodiment 7 | 15 | 45 | 20 | 19 | 0 | 0 | 1 | 1.053 | 4.3 | 12.7 |
| Embodiment 8 | 15 | 49 | 5 | 10 | 10 | 10 | 1 | 0.5 | 3.7 | 11.0 |
| Comparison 1 | 0 | 54 | 15 | 15 | 10 | 5 | 1 | 1 | 3.4 | 6.5 |
| Comparison 2 | 24 | 40 | 15 | 15 | 0 | 5 | 1 | 1 | 3.5 | 7.1 |
| Comparison 3 | 5 | 25 | 15 | 24 | 15 | 15 | 1 | 0.625 | 4.2 | 5.3 |
| Comparison 4 | 5 | 64 | 15 | 10 | 0 | 5 | 1 | 1.500 | 3.7 | 8.1 |
| Comparison 5 | 5 | 50 | 15 | 5 | 19 | 5 | 1 | 3 | 3.9 | 8.4 |
| Comparison 6 | 5 | 40 | 15 | 35 | 4 | 0 | 1 | 0.5 | 2 | 9.2 |
| Comparison 7 | 15 | 45 | 24 | 10 | 0 | 5 | 1 | 2.4 | 3.5 | 5.1 |
| Comparison 8 | 15 | 35 | 34 | 10 | 0 | 5 | 1 | 3.4 | 1.0 | 9.5 |
| Comparison 9 | 5 | 50 | 14 | 30 | 0 | 0 | 1 | 0.467 | 4.5 | 5.4 |

As shown in Table 1, compared with Comparisons 1-9, the solar cell electrodes fabricated using the glass frit composition prepared in Embodiments 1-8 exhibit considerably high adhesive strength with respect to the ribbons as well as excellent conversion efficiency. Comparisons 1-9 show low cell efficiency or low pull strength or both of them.

Comparison 1 shows that glass frit does not contain PbO, while comparison 2 shows that the glass frit contains higher PbO, and the efficiency and pull strength of the prepared solar electrode are relatively low as compared to the embodiments of the invention. Similarly, Comparison 3 and Comparison 4 show that glass frit contains lower or higher $Bi_2O_3$ and the efficiency of the prepared solar cell is low. Comparison 5 and Comparison 6 show that the content of $WO_3$ is not within the scope of the present invention, and the efficiency or pull strength of the prepared solar cell is low or both are low. Comparison 7, Comparison 8 and Comparison 9 show that a higher or lower content ratio of $TeO_2$ to $WO_3$ is not within the scope of the present invention, and the efficiency or pull strength of the prepared solar cell is low or both are low.

The embodiments show that glass frit contains 0.1-20 wt % of lead oxide, 30-60 wt % of bismuth oxide, 1.0-20 wt % of tellurium oxide, and 5-25 wt % of tungsten oxide, a mass ratio of $TeO_2$ to $WO_3$ within a range of 0.5:1 to 1.75:1, and the solar cells formed have better properties.

The above is only the preferable embodiments of the present invention, and not intended to limit the present invention. The present invention is susceptible to various modifications and changes to those skilled in the art. Any modifications, equivalent replacements, improvements and the like made within the principles of the present invention should fall within the scope of protection of the present invention.

What is claimed is:

1. A paste composition for forming a solar cell electrode, comprising a conductive powder, an organic vehicle and a glass frit, wherein the glass frit comprises 0.1-20 wt % of PbO, 30-60 wt % of $Bi_2O_3$, 1.0-15 wt % of $TeO_2$ and 8-30 wt % of $WO_3$, and a mass ratio of $TeO_2$ to $WO_3$ ranging from 1:1 to 1.75:1.

2. The paste composition according to claim 1, wherein the glass frit further comprises an oxide, the oxide being one or more oxides selected from a group consisting of $Li_2O$, $Na_2O$, $K_2O$, MgO, CaO, SrO, BaO, $P_2O_5$, ZnO, $SiO_2$, $B_2O_3$, $TiO_2$ and NiO.

3. The paste composition according to claim 2, wherein the oxide in the glass fit is 1-25 wt %.

4. The paste composition according to claim 1, wherein an average particle diameter $D_{50}$ of the glass frit is 0.1-10 μm.

5. The paste composition according to claim 1, wherein the paste composition comprises 60-95 wt % of conductive powder, 1.0-20 wt % of the organic vehicle, 0.1-5 wt % of glass frit, and the balance of additive.

6. The paste composition according to claim 5, wherein the additive is one or more additives selected from a group consisting of a dispersant, a thixotropic agent, a plasticizer, a viscosity stabilizer, an anti-foaming agent, pigment, a UV stabilizer, an antioxidant and a coupling agent.

7. The paste composition according to claim 1, wherein the conductive powder is silver powder.

8. The paste composition according to claim 7, wherein the average particle diameter $D_{50}$ of the silver powder is 0.1-10 μm.

9. A solar cell electrode, prepared from the paste composition according to claim 1.

10. A solar cell, comprising an electrode, wherein the electrode is the solar cell electrode according to claim 9.

* * * * *